(12) United States Patent
Nguyen

(10) Patent No.: US 8,012,877 B2
(45) Date of Patent: Sep. 6, 2011

(54) BACKSIDE NITRIDE REMOVAL TO REDUCE STREAK DEFECTS

(75) Inventor: Scott Cuong Nguyen, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 367 days.

(21) Appl. No.: 12/273,835

(22) Filed: Nov. 19, 2008

(65) Prior Publication Data

US 2010/0123221 A1   May 20, 2010

(51) Int. Cl.
*H01L 21/302* (2006.01)

(52) U.S. Cl. ........ 438/689; 438/734; 438/723; 438/738; 438/756; 438/724; 438/743; 438/757; 438/744

(58) Field of Classification Search .................. 438/689, 438/723, 734, 738, 756, 724, 743, 757, 744
See application file for complete search history.

(56) References Cited

U.S. PATENT DOCUMENTS

| | | | | |
|---|---|---|---|---|
| 5,968,842 A * | 10/1999 | Hsiao | | 438/692 |
| 2006/0254612 A1 * | 11/2006 | Farrar | | 134/1.1 |
| 2006/0267099 A1 * | 11/2006 | Takano et al. | | 257/350 |
| 2008/0233701 A1 * | 9/2008 | Li | | 438/299 |
| 2009/0093119 A1 * | 4/2009 | Lee | | 438/692 |

* cited by examiner

*Primary Examiner* — N Drew Richards
*Assistant Examiner* — Jae Lee
(74) *Attorney, Agent, or Firm* — Warren L. Franz; Wade J. Brady, III; Frederick J. Telecky, Jr.

(57) ABSTRACT

Exemplary embodiments provide a method for fabricating an integrated circuit (IC) device with reduced streak defects. In one embodiment, the IC device structure can be formed having a first pad oxide-based layer on a front side of a semiconductor substrate and having an oxide-nitride-based structure on a backside of the semiconductor substrate. The IC device structure can be etched to remove a nitride-related material from the backside oxide-nitride-based structure, and further to remove the first pad oxide-based layer from the front side of the semiconductor substrate. On the removed front side of the semiconductor substrate a second pad oxide-based layer can be formed, e.g., for forming an isolation structure for device component or circuitry isolation.

19 Claims, 2 Drawing Sheets

BACKSIDE NITRIDE REMOVAL TO REDUCE STREAK DEFECTS

DESCRIPTION OF THE INVENTION

1. Field of the Invention

This invention generally relates to the fabrication of integrated circuit (IC) devices and, more particularly, to the fabrication processes of IC devices having reduced streak defects.

2. Background of the Invention

In a process for fabricating integrated circuit devices, for example a transistor fabrication process for forming isolation structures, a pad oxide layer from previous fabrication step needs to be removed prior to an isolation pad oxide/nitride deposition. The removal of this pad oxide layer is often conducted using a composition of 0.49% hydrofluoric acid (HF) for a time period of 990 seconds or longer.

During this long HF etching process, an oxy-nitride layer from the backside of the wafer is also partially etched, causing byproducts that stick to the front of the adjacent wafer. A significant number of streak defects are therefore generated when wafers are pulled out from the process bath. For example, gate oxide uniformity issues have been found due to the existing of the backside nitride of the oxy-nitride layer on the wafer.

Thus, there is a need to overcome these and other problems of the prior art and to provide a method for forming a semiconductor IC device having an early backside nitride removal to reduce streak defects.

SUMMARY OF THE INVENTION

According to various embodiments, the present teachings include a method for fabricating an integrated circuit (IC) device. In one embodiment, a first pad oxide-based layer can be formed on a front side of a semiconductor substrate and an oxide-nitride-based structure can be formed on a backside of the semiconductor substrate. The backside oxide-nitride-based structure can then be etched to remove a nitride-related material therefrom and the first pad oxide-based layer can be removed from the front side of the semiconductor substrate. On the removed front side of the semiconductor substrate, a second pad oxide-based layer can further be formed, e.g., for fabricating an isolation structure for an IC device. Such IC device with the isolation structure can be processed according to specific fabrication designs and applications.

According to various embodiments, the present teachings also include a method for forming a semiconductor device with reduced streak defects. In this method, an integrated circuit (IC) device structure can be formed including a pad oxide-based layer on a front side of a semiconductor substrate and an oxy-nitride layer on a backside of the semiconductor substrate. The pad oxide-based layer on the front side of the semiconductor substrate can then be partially etched using a composition containing hydrofluoric acid; and the backside oxy-nitride layer can be etched using a composition containing phosphoric acid. Following the etching process of the backside oxy-nitride layer, the pad oxide-based layer can be removed from the front side of the semiconductor substrate using a composition containing hydrofluoric acid, and a second pad oxide-based layer can be formed on the front side surface of the semiconductor substrate. In one embodiment for forming an isolation structure for the IC device structure, a second pad nitride layer can be formed on the second pad oxide layer. Such isolation structure can be used for device component or circuitry isolation.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1:
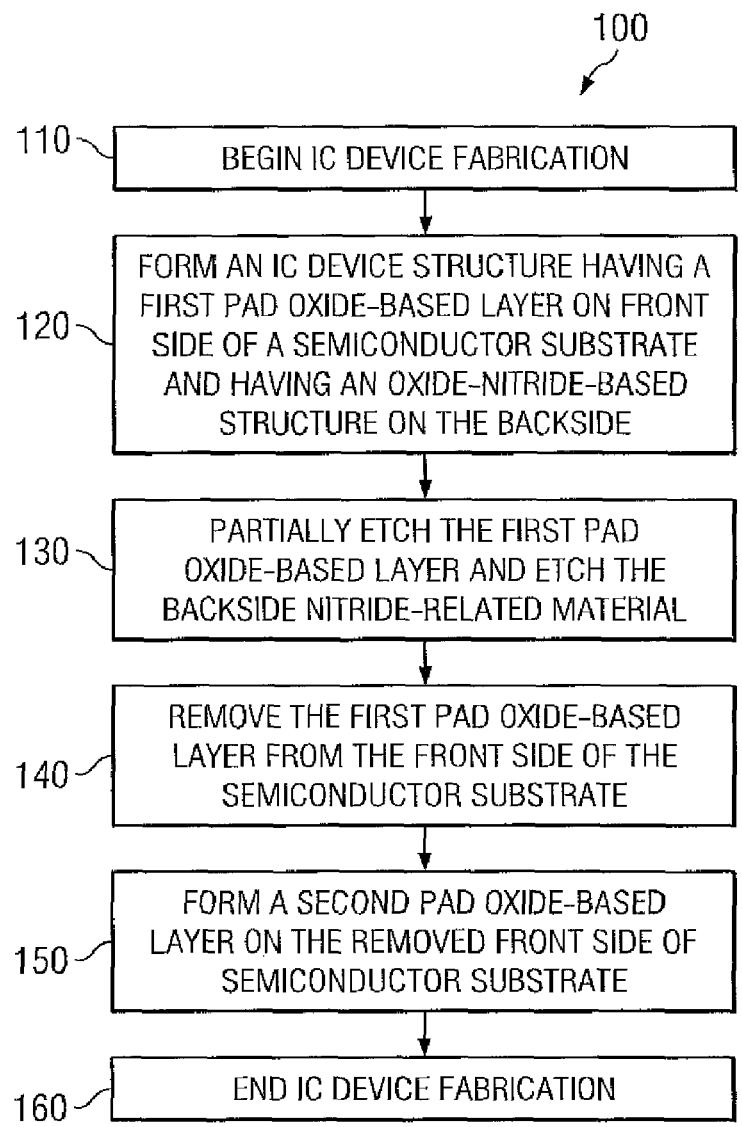
FIG. 1 depicts an exemplary method for reducing streak defect in semiconductor fabrication in accordance with the present teachings.

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide a method for fabricating an integrated circuit (IC) device with reduced streak defects In one embodiment, the IC device structure can be formed having a first pad oxide-based layer on a front side of a semiconductor substrate and having an oxide-nitride-based structure on a backside of the semiconductor substrate. The IC device structure can be etched to remove a nitride-related material from the backside oxide-nitride-based structure, and further to remove the first pad oxide-based layer from the front side of the semiconductor substrate. On the removed front side of the semiconductor substrate a second pad oxide-based layer can be formed, e.g., for forming an isolation structure for device component or circuitry isolation.

FIG. 1 depicts an exemplary method 100 for reducing streak defect in semiconductor fabrication. FIGS. 2A-2D depict cross sectional views of an exemplary semiconductor device at various stages based on the method 100 depicted in FIG. 1. Note that although the method 100 will be described with reference to FIGS. 2A-2D for illustrative purposes, the process of method 100 is not limited to the structures shown in FIGS. 2A-2D. Rather, the methods (and structures) are to be considered independent of one another and able to stand alone and be practiced without regard to any of the particular aspects depicted in the figures.

In addition, while the method 100 of FIG. 1 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. Also, not all illustrated steps may be required to implement a methodology in accordance with one or more aspects or embodiments of the present invention Further, one or more of the acts depicted herein may be carried out in one or more separate acts and/or phases.

Figure 2A:
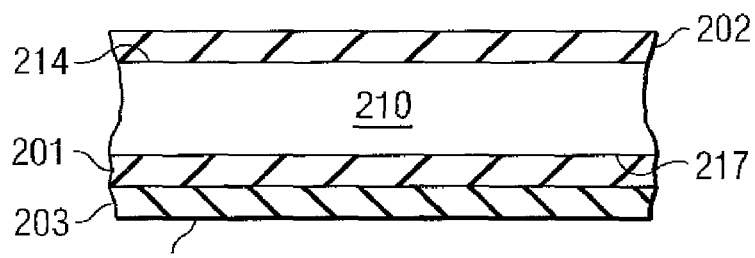
FIGS. 2A-2D depict cross sectional views of an exemplary semiconductor device at various fabrication stages based on the method of FIG. 1 in accordance with the present teachings

As shown, the method 100 can begin at 110, e.g., for an integrated circuit (IC) fabrication, such as a transistor fabrication. At 120, an exemplary semiconductor device structure can be formed including a first pad oxide-based layer 202 formed on a front side surface 214 of a semiconductor substrate 210 as shown in FIG. 2A. In addition, an oxide-nitride-based backside structure can be formed on a backside surface 217 of the semiconductor substrate 210. For example, the oxide-nitride-based backside structure can include a backside oxide-based layer 201 formed on the backside surface 217 of the semiconductor substrate 210 and a backside nitride-based layer 203 formed on the backside oxide layer 201 from the backside of the semiconductor device. In various embodiments, the backside nitride-based layer 203 can have an oxy-nitride surface 231 from the backside.

In various embodiments, the oxide-based layer can be referred to as a silicon oxide layer or a layer including any other oxide materials for fabricating IC devices. Likewise, the nitride-based layer can be referred to as a silicon nitride layer or a layer including any other nitride materials for fabricating IC devices. Similarly, the oxide-nitride structure (or the oxy-nitride surface) can be referred to as a structure (or a surface) including both silicon oxide and silicon nitride or including any other oxide materials and nitride materials for fabricating IC devices.

In various embodiments, the layers 201, 202, 203 and 210 shown in FIG. 2A, as with all layers described herein, can be formed in any suitable manner, including, but not limited to spin on, sputtering, growth and/or deposition techniques, etc.

In various embodiments, the front side 214 of the semiconductor substrate 210 (e.g., a wafer) can be referred to as an active side of the semiconductor substrate 210 or the wafer, or as including active regions. This designation is based upon the fact that semiconductor devices and/or circuitry will eventually be formed on the front side 214 of the semiconductor substrate 210 or the wafer, as opposed to on the back or in-active side 217 of the semiconductor substrate 210, whereon no such features will be formed.

In various embodiments, the semiconductor substrate 210 as used herein can include any type of semiconductor body (e.g., silicon, SOI (silicon on insulator), or SiGe), such as a semiconductor wafer or one or more die on a wafer, as well as any other type of semiconductor and/or epitaxial layers associated therewith.

Figure 2B:
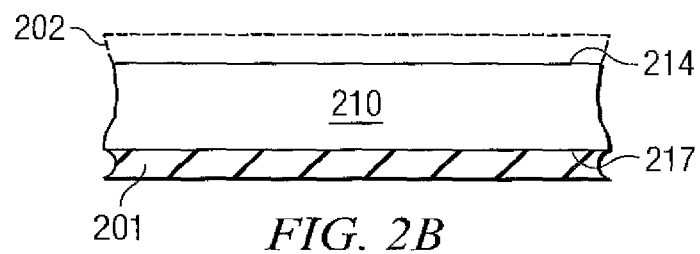

At 130 in FIG. 1, the oxide-based layer 202 can be partially etched from the front side 214 of the semiconductor substrate 210 and the nitride-based material, such as the layer 203 shown in FIG. 2A, can be removed from the backside 217 of the semiconductor device, as shown in FIG. 2B.

In one embodiment, a composition (e.g., a solution) that is about 0.49% hydrofluoric acid (HF) can be applied (e.g., spun on or immersed in) to the semiconductor device shown in FIG. 2A. As a result show in FIG. 2B, the oxide-based layer 202 can be partially removed from the front side, i.e., the active side of the semiconductor substrate 210. Meanwhile, in some cases, some "undercutting" can occur around the edges of the oxide-based layer 201 from the backside 217 of the semiconductor substrate 210.

Following the etching process of oxide-based material, nitride-based material can be removed by using a composition that contains phosphoric acid ($H_3PO_4$) as known to one of ordinary skill in the art. In various embodiments, nitride-based flakes may occur during the etching processes and may be further removed using suitable compositions, for example, a solution containing a hydroxide such as ammonium hydroxide ($NH_4OH$), hydrogen peroxide ($H_2O_2$) in deionized (DI) water, and/or using suitable mechanical processes, e.g., sonication using a megasonic power at desired frequencies.

In an exemplary embodiment, at 130 of FIG. 1, most of the first pad oxide-based layer 202 can be removed by using the exemplary etching composition (e.g., a solution) that is about 0.49% hydrofluoric acid (HF) and at a time length of, for example, about 600 seconds from the front side 214, while the nitride-based layer 203 containing the oxy-nitride surface and possibly nitride-based flakes can be removed using the exemplary phosphoric acid based etching bath at a time length of, for example, about 3100 seconds or longer, followed by, e.g., a megasonics of the etching materials in the solution containing ammonium hydroxide ($NH_4OH$), hydrogen peroxide ($H_2O_2$) and deionized (DI) water, for about 600 seconds.

Figure 2C:
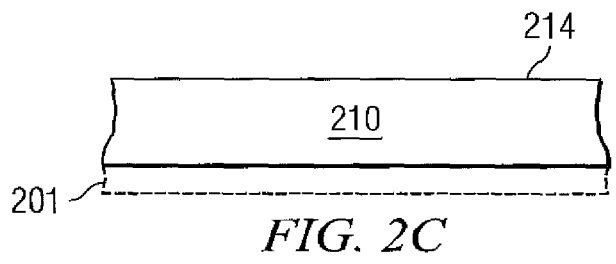

At 140 of FIG. 1, the oxide-based layer 202 can be removed from the front side 214 of the semiconductor substrate 210 using a short etching time, for example, about 300 seconds with the HF-based etching composition. In some cases, the oxide-based layer 201 can also be partially or wholly removed from the backside 217 of the semiconductor substrate 210. For example, FIG. 2C depicts an exemplary resulting semiconductor device from this short time etching or removal process of the oxide-based layer 202. In various embodiments, the exposed front side surface 214 of the semiconductor substrate 210 can be further cleaned or polished in a suitable manner.

At 150 of FIG. 1, the device structure shown in FIG. 2C can be processed as desired for device/circuit development. For example, as shown in FIG. 2D, a second pad oxide-based layer 252 can be formed on the exposed front side surface 214 of the semiconductor substrate 210 depending on specific device designs and applications.

Note that although the method 100 of FIG. 1 can conclude at 160, one of ordinary skill in the art would understand that various fabrication processes can be continued to form desired IC devices.

Figure 2D:
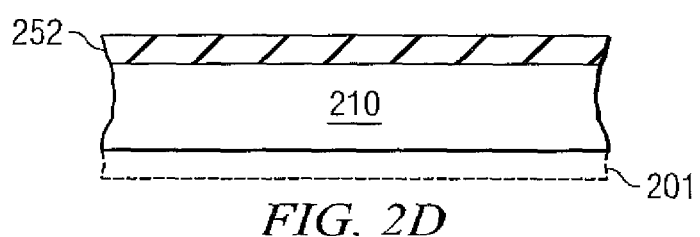

For example, a second pad nitride-based layer (not illustrated) can be formed on the second pad oxide-based layer 252 of the device shown in FIG. 2D. In an exemplary embodiment, the layered structure on the front side 214 including the second oxide-based layer 252 and the overlaying second nitride-based layer can be patterned to form isolation structures for device component or circuitry isolation. In an exemplary embodiment, the isolation structure can be formed by an oxidation process, which usually forms thick field oxide. The transistor structure can then be formed by first forming a thin gate oxide, followed by a poly silicon layer (or other conductive material) deposition, which is subsequently patterned to form a gate by a selectively etching process, for example.

In various embodiments, the polysilicon layer can include a dopant, such as a p-type dopant (e.g., boron) or n-type dopant (e.g., phosphorus), depending upon the type(s) of transistors to be formed. For example, the dopant can be in the polysilicon as originally applied, or may be subsequently added thereto (e.g., via a doping process).

Subsequent processes can also include spacer side wall formation, e.g., using nitride layer deposition and etching, and include source/drain area formation, e.g., by an implantation process. For example, depending upon the type(s) of transistors to be formed, left and right sidewall spacers can be formed along left and right lateral sidewalls of the patterned gate structure. Implants to form the source (S) region and the drain (D) region can then be performed, wherein any suitable masks and implantation processes can be used in forming the source and drain regions to achieve desired transistor types. For example, a PMOS source/drain mask can be utilized to define one or more openings through which a p-type source/drain implant (e.g., boron-based) can be performed to form p-type source and drain regions for PMOS transistor devices. Similarly, an NMOS source/drain mask can be employed to define one or more openings through which an n-type source/drain implant (e.g., phosphorous (P) and/or arsenic (As)) can be performed to form n-type source and drain regions for NMOS transistor devices. Depending upon the types of masking techniques employed, such implants can also selectively dope the poly-silicon of the gate structure of certain transistors, as desired. A channel region can thus be defined in the semiconductor substrate under the gate structure and between the source and drain regions.

As disclosed herein, the early removal of the backside nitride at 130 of FIG. 1 and/or as shown in FIG. 2B, can reduce streak defects of the fabricated IC device. For example, inspection data at the fabrication process of the moat pattern (i.e., to define active regions of the device) indicates a significant reduction of the streak defects as compared with that using a conventional fabrication process where the backside nitride is not removed until the gate oxidation process.

Figure 3:
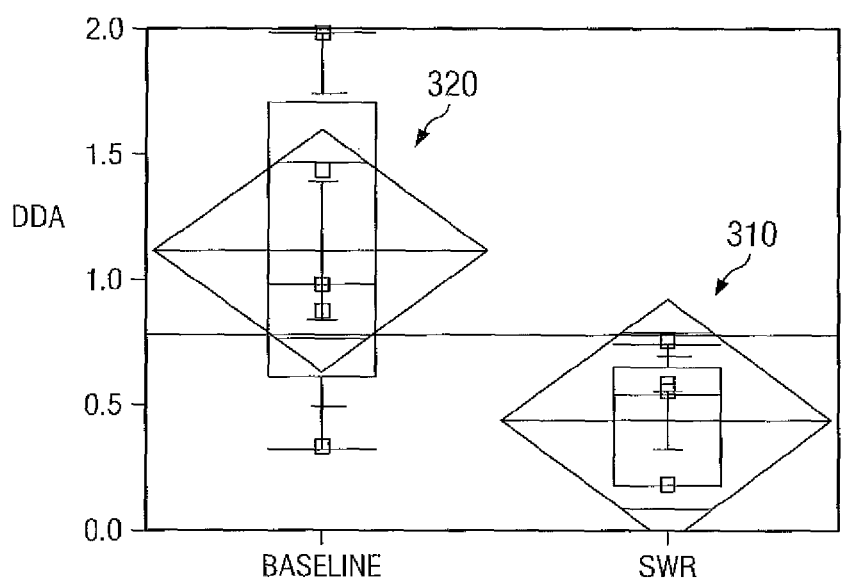
FIG. 3 depicts an exemplary inspection result on the fabricated IC device in accordance with the present teachings.

FIG. 3 depicts an exemplary inspection result on the fabricated IC device in accordance with the present teachings. For example, FIG. 3 compares defect density of the disclosed IC device (see 310) having an early backside nitride removal during its fabrication process with the conventional IC device (see 320) without using the early backside nitride removal. As shown, the defect density is significantly reduced for the disclosed IC device. In addition, experimental results indicate that the early backside nitride removal can improve the fabrication yield of the fabricated IC devices.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for fabricating an integrated circuit (IC) device comprising:
    forming a first pad oxide layer on a front side of a semiconductor substrate;
    partially etching the first pad oxide layer using a composition containing hydrofluoric acid;
    following the partial etching, etching the backside of the semiconductor substrate to remove a nitride therefrom;
    following the backside etching, removing the partially etched first pad oxide layer from the front side of the semiconductor substrate using a composition containing hydrofluoric acid; and
    after removing the partially etched first pad oxide layer, forming a second pad oxide-layer on the front side of the semiconductor substrate for forming an isolation structure for an IC device.

2. The method of claim 1, further comprising megasonically cleaning the IC device after the backside etching.

3. The method of claim 1, further comprising forming a pad nitride layer on the second pad oxide layer for forming the isolation structure for the IC device.

4. The method of claim 3, further comprising forming a gate structure isolated by the isolation structure formed from the pad nitride layer on the second pad oxide layer.

5. The method of claim 2, wherein the megasonic cleaning includes using a composition containing ammonium hydroxide, hydrogen peroxide and deionized water prior to the formation of the second pad oxide-based layer.

6. The method of claim 1, further comprising forming a pad nitride layer on the second pad oxide layer; and patterning the pad nitride layer and second pad oxide layer to form isolation structures.

7. The method of claim 6, wherein forming the isolation structures further comprises forming a field oxide by an oxidation process.

8. The method of claim 1, wherein the partial etching utilizes a solution of about 0.49% hydrofluoric acid.

9. The method of claim 8, wherein the partial etching is done for about 600 seconds; and the removing is done by etching with the solution of about 0.49% hydrofluoric acid for about 300 seconds.

10. The method of claim 9, wherein the backside etching comprises using a phosphoric acid etching bath for about 3100 seconds or longer.

11. The method of claim 10, further comprising removing nitride-based flakes that may occur during the etching steps using a sonication of the etching materials in a solution containing ammonium hydroxide, hydrogen peroxide and deionized water for about 600 seconds.

12. The method of claim 1, further comprising removing nitride-based flakes that may occur during the etching steps using at least one of a solution containing a hydroxide, hydrogen peroxide in deionized water or a mechanical process.

13. The method of claim 12, wherein the hydroxide comprises ammonium hydroxide; and the mechanical process comprises sonication.

14. The method of claim 1, wherein the first pad oxide layer comprises silicon oxide.

15. The method of claim 14, wherein the backside from which the nitride material is removed includes a backside nitride layer formed over a backside oxide layer.

16. A method for fabricating an integrated circuit (IC) device, comprising:
    forming a first pad oxide-based layer on a front side of a semiconductor substrate and forming an oxide-nitride-based structure on a backside of the semiconductor substrate;
    partially etching the first pad oxide-based layer using a composition containing hydrofluoric acid for about 600 seconds;
    etching the backside oxide-nitride-based structure to remove a nitride-related material therefrom using a composition containing phosphoric acid for about 3100 seconds or longer;
    removing the partially etched first pad oxide-based layer using a composition containing hydrofluoric acid for about 300 seconds;
    megasonically cleaning the etched IC device using a composition containing ammonium hydroxide and hydrogen peroxide for about 600 seconds; and
    after removing the partially etched first pad oxide-based layer, forming a second pad oxide-based layer on the front side of the semiconductor substrate for forming an isolation structure for an IC device.

17. The method of claim 16, wherein forming the oxide-nitride-based structure on the backside comprises,
    forming a backside oxide-based layer on the backside surface of the semiconductor substrate; and
    forming a backside nitride-based layer on the formed backside oxide-based layer.

18. The method of claim 17, wherein the backside oxide-nitride-based structure further comprises an oxy-nitride surface on the backside nitride-based layer.

19. The method of claim 18, wherein etching the backside oxide-nitride-based structure comprises etching the oxy-nitride surface and etching the backside nitride-based layer.

* * * * *